(12) United States Patent
Singh et al.

(10) Patent No.: US 6,558,965 B1
(45) Date of Patent: May 6, 2003

(54) MEASURING BARC THICKNESS USING SCATTEROMETRY

(75) Inventors: Bhanwar Singh, Morgan Hill, CA (US); Ramkumar Subramanian, Sunnyvale, CA (US); Christopher F. Lyons, Fremont, CA (US); Marina V. Plat, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/901,702

(22) Filed: Jul. 11, 2001

(51) Int. Cl.$^7$ ................................................ H01L 21/66
(52) U.S. Cl. ........................................................ 438/14
(58) Field of Search .......................... 438/14, 15, 636; 438/16; 430/315, 270.1

(56) References Cited

U.S. PATENT DOCUMENTS

| | | | |
|---|---|---|---|
| 5,867,276 A | 2/1999 | McNeil et al. | |
| 5,912,741 A | 6/1999 | Carter et al. | |
| 5,965,461 A | 10/1999 | Yang et al. | |
| 6,319,821 B1 * | 11/2001 | Liu | 438/636 |
| 6,365,320 B1 * | 4/2002 | Foote | 430/270.1 |
| 6,383,824 B1 * | 5/2002 | Lensing | 438/14 |

OTHER PUBLICATIONS

Christopher J. Raymond et al., *Metrology of Subwavelength Photoresist Gratings Using Optical Scttermotery; Journal of Vacuum Science& Technology B second series vol. 13 No. 4 Jul./Aug. 1995*, pp. 1484–1495.

Ziad R. Hatab et al., *Sixteen–Megabit Dynamic Random Access Memory Trench Depth Characterization Using Two–Dimensional Diffraction Analysis, Journal of Vacuum Science & Technology B second series vol. 13 No. 2 Mar./Apr. 1995*, pp. 174–182.

"Passive and fixed alignment of devices using flesxible silicond elements formed by selected etching" Carola Stramdman and Yiva Backlund; PII S0960–1317 (98)80928–5; J. Micromech. Microeng. 8 (1998), pp. 39–44; Printed in the UK.*

* cited by examiner

Primary Examiner—John F. Niebling
Assistant Examiner—Andre C Stevenson
(74) Attorney, Agent, or Firm—Foley & Lardner

(57) ABSTRACT

A method of forming a semiconductor device is described. A bottom anti-reflective coating (BARC) is formed in a plurality of holes and on a first surface of a layer of a semiconductor device. A scatterometry measurement on at least a portion of the BARC is performed to produce measurement diffraction data. A thickness of the BARC in the plurality of holes is predicted by comparing the first diffraction data to a model of diffraction data to provide a predicted thickness, $t_p$, and it is determined if the predicted thickness, $t_p$, is within a target thickness range, $\Delta t_d$. The forming of the BARC is controlled in response to the prediction of the BARC thickness. A corresponding thickness control device for controlling the BARC thickness is also disclosed.

14 Claims, 5 Drawing Sheets

MEASURING BARC THICKNESS USING SCATTEROMETRY

CROSS-REFERENCE TO RELATED APPLICATIONS

This application is related to the following applications:
1. Ser. No. 09/901,704 entitled "E-BEAM FLOOD EXPOSURE OF SPIN-ON MATERIAL TO ELIMINATE VOIDS IN VIAS".
2. Ser. No. 09/901,701 entitled "E-BEAM SENSITIVE MATERIAL TO CONTROL VIA FILL DEPTH".
3. Ser. No. 09/901,699 entitled "DUAL BAKE FOR BARC FILL WITHOUT VOIDS".

BACKGROUND OF THE INVENTION

1. Field of the Invention

This invention relates generally to measuring thin film thicknesses in semiconductor device fabrication. In particular, this invention relates to measuring the thickness of a bottom anti-reflective coating (BARC) over a plurality of holes in a layer of a semiconductor device.

2. Description of the Related Art

A continuing trend in semiconductor devices is the reduction of feature size to decrease the distance between components on devices and thus increase device speed and computational power of devices. As feature size shrinks to submicron size, traditional optical methods of resolving features become less precise.

Optical scatterometry does provide a method of determining small features in semiconductor processing. Exemplary of prior art scatterometry measurements in the context of semiconductor processing are: Christopher J. Raymond et. al., "Metrology of Subwavelength Photoresist Gratings Using Optical Scatterometry", Journal of Vacuum Science and Technology, B, Vol. 13(4), July/August, pp. 1484–1495 (1995); Ziad R. Hatab et. al., "Sixteen-megabit Dynamic Random Access Memory Trench Depth Characterization Using Two-dimensional Diffraction Analysis", Journal of Vacuum Science and Technology, B, Vol. 13(2), March/April, pp. 174–182 (1995); and U.S. Pat. No. 5,876,276 to McNeil et al.

SUMMARY OF THE INVENTION

According to an embodiment of the present invention there is provided a method for forming a semiconductor device. The method includes providing a semiconductor substrate with a first layer, the first layer having a first surface and a plurality of holes therein; forming a bottom antireflective coating (BARC) in the plurality of holes and on the first surface; performing a scatterometry measurement on at least a portion of the BARC to produce measurement diffraction data; predicting a thickness of the BARC in the plurality of holes by comparing the measurement diffraction data to a model of diffraction data to provide a predicted thickness, $t_p$, and determining if the predicted thickness, $t_p$, is within a target thickness range, $\Delta t_t$; and controlling the BARC forming step in response to the BARC thickness predicting step.

According to another embodiment of the present invention there is provided a thickness control device that controls the thickness of a bottom anti-reflective coating (BARC) in a plurality of holes in a layer on a semiconductor substrate. The device includes a scatterometer that produces scatterometry diffraction data of the BARC; a computational unit operative for predicting the thickness of the BARC in the plurality of holes by comparing the diffraction data of the BARC to a model of diffraction data to provide a predicted thickness, $t_p$; and a process controller receiving the predicted thickness from the computational unit for controlling the thickness of the BARC in the plurality of holes to be within a target thickness range, $\Delta t_t$.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DETAILED DESCRIPTION OF THE PREFERRED EMBODIMENTS

The present inventors have realized that forming a bottom anti-reflective coating (BARC) in via or contact holes has problems in that the BARC may not fill the holes completely. The present inventors have further realized that scatterometry is an appropriate method for measuring the thickness of the BARC in the holes and can provide in-situ monitoring and real-time feedback in a process loop during BARC formation. Thus, in the present invention scatterometry is specifically used to determine the thickness of a BARC in via or contact holes.

Figure 1A:
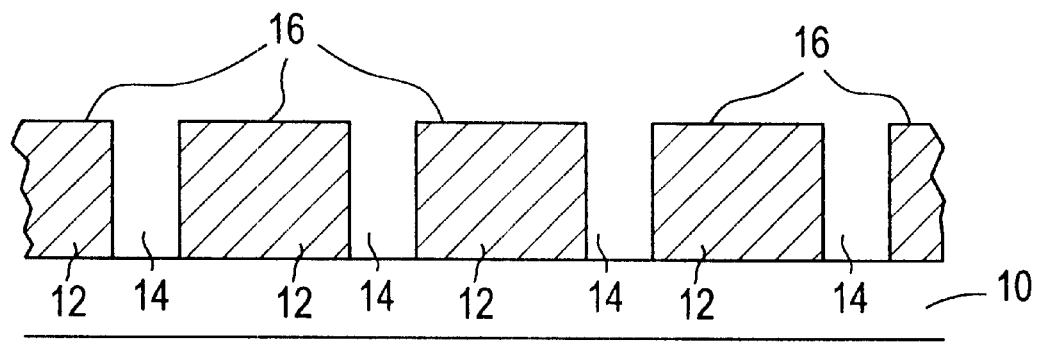
FIGS. 1A–1D illustrate cross-sectional views of a process in accordance with an embodiment of the present invention.

FIGS. 1A through 1D illustrate cross-sectional views of a portion of a semiconductor device during a process in accordance with an embodiment of the present invention. In FIG. 1A a semiconductor substrate 10 is provided. The substrate includes a first layer 12. The first layer 12 may be an insulating layer such as an inter-level dielectric (ILD). Suitable materials for the ILD include the non-limiting examples of silicon oxide ($SiO_x$) and silicon nitride ($SiON_x$), and combinations of these materials. If the first layer 12 is to be an ILD between wiring layers, it may be desired that the ILD be a low-k dielectric to reduce the capacitance between wiring layers, as is known in the art.

The first layer 12 includes a plurality of holes 14, such as via holes or contacts holes, to connect an overlying conductive layer (not shown) to an underlying conductive layer (not shown). The plurality of holes 14 may be formed by dry etching using photolithographic techniques, as is known in the art. The first layer 12 has a first surface 16 on the top of the first layer 12.

Figure 1B:
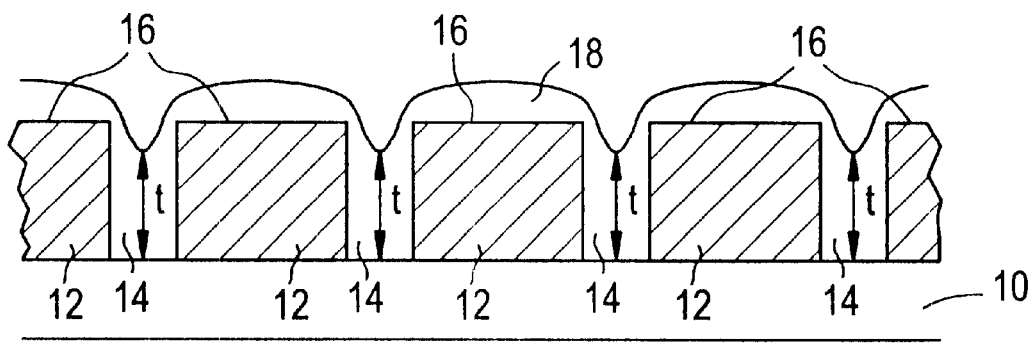

In FIG. 1B a BARC 18 is formed over the semiconductor substrate 10. The BARC 18 is preferably a conventional spin-on organic material, such as, for example, polyimides, polysulfones, and/or the like, that forms a thin film. Specifically, the BARC may be, for example, KrF17b from AZ-CLARIANT or AR7 made by Shipley. Organic materials such as these and techniques for applying them in thin films are well known to those skilled in the art.

Methods of forming the BARC are well-known in the art. Typically, a BARC solution is dispensed over the substrate 10 and the substrate is spun to uniformly coat the substrate, and then cured to form the BARC material.

The BARC 18 is formed both on the first surface 16 and in the plurality of holes 14. In FIG. 1B the BARC has a thickness t in the plurality of holes 14.

A first scatterometry measurement is now performed on the semiconductor substrate. Incident light 20 from a scatterometer (described later) illuminates the substrate including the BARC 18. The incident light 20 is incident on the substrate at an angle θ with respect to a normal to the top surface of the substrate. The incident light is scattered and diffracted by the substrate, including the BARC 18 and other layers of the substrate. The scattered light 22 that is scattered at an angle −θ with respect to a normal to the substrate is detected by a light detector of a scatterometry substrate (described later).

The intensity of the scattered light for a range of angles θ (and correspondingly −θ) may be measured by scanning over the range. Thus diffraction data as a function of the angle θ is measured. Alternatively, the angle θ may remain fixed, and the intensity of the scattered light measured over a range of light wavelengths. The diffraction data of the scatterometry measurement is compared with a model of diffraction data to predict the thickness t of the BARC 18. This prediction provides a predicted thickness, $t_p$. The diffraction data model is dependent upon the thickness of the BARC in the plurality of holes. In other words, in the model, the thickness of the BARC in the holes is a parameter. The details of the prediction and the model of diffraction data will be described later.

The predicted thickness, $t_p$, is then compared to a target thickness range, $\Delta t_r$. If the predicted thickness, $t_p$, is not within the target thickness range, $\Delta t_r$, then the BARC formation is continued. If the predicted thickness, $t_p$, is within the target thickness range, $\Delta t_r$, then the BARC formation is not continued. The target thickness range, $\Delta t_r$, is set as desired. The target thickness range may be quite narrow, i.e., essentially a single value, if desired. The target thickness range may also be open ended, i.e., the target thickness range may have only a lower bound.

Figure 1C:
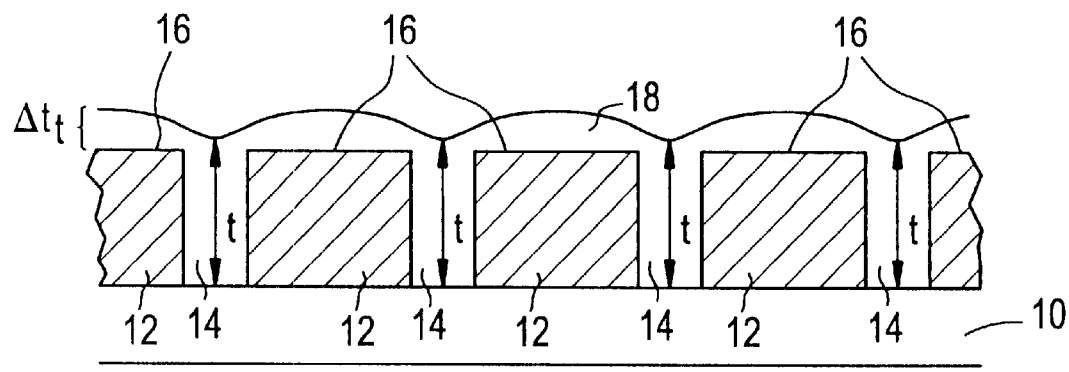

FIG. 1C illustrates the situation where the thickness t of the BARC 18 is within the target thickness range, $\Delta t_r$. The target thickness range, $\Delta t_r$, is illustrated by the brackets in FIG. 1C, where the lower bound of the target thickness range is the distance from the substrate 10 to the plane of the first surface 16. The upper bound of the target thickness range, $\Delta t_r$, is, of course, greater than the lower bound of the thickness. If the predicted thickness, $t_p$, is also within the target thickness range, $\Delta t_r$, then the formation of the BARC is controlled to stop.

The BARC may be formed continuously while the scatterometry measurement is performed and while the thickness, $t_p$, is predicted. Alternatively, the BARC formation may be intermittent. For example BARC formation may be stopped while the scatterometry measurement is performed and while the thickness, $t_p$, is predicted. The BARC formation may then resume if $t_p$ is not in the target range, $\Delta t_r$.

Figure 1D:
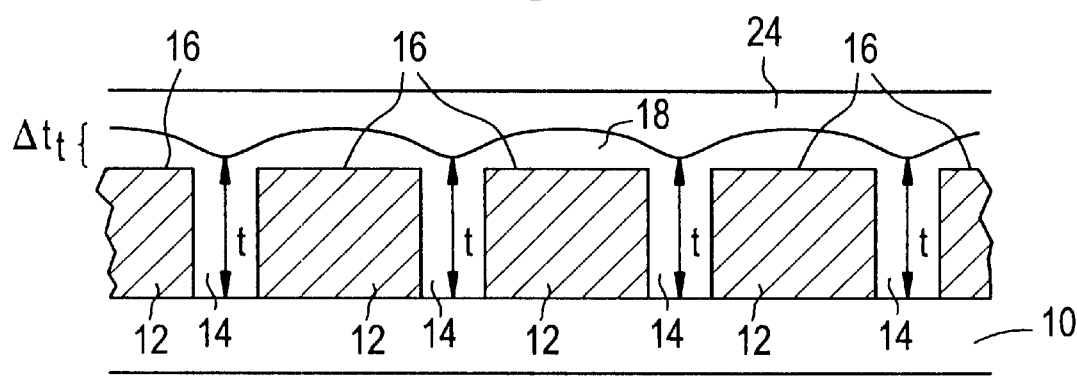

FIG. 1D is an optional step where a photoresist layer 24 is formed over the BARC 18 after the formation of the BARC 18 has been completed. In this case, the BARC 18 is preferably configured, or tuned, to suppress interference waves to provide destructive interference at the wavelength at which the photoresist layer 24 is exposed during subsequent photolithographic processing. Thus, the BARC 18 acts to reduce any back reflections into the overlying resist layer. Back reflections tend to limit the patterning and resolution capabilities of the resist mask formed during the photolithography process.

The scatterometry measurements and thickness prediction (and thus the BARC thickness control) may be performed either during the spin-on process or during the curing process of the BARC.

Diffraction Data Model (Calibration Phase)

Techniques for constructing the diffraction data model are now described. Constructing the diffraction data model is part of the calibration phase of the process. Generally, the calibration phase is performed before the BARC 18 is begun to be formed. Also, generally, the calibration phase takes a longer time to perform than a later thickness prediction phase, where the predicted thickness, $t_p$, is determined.

Because in the later prediction phase the thickness of the BARC 18 is predicted using the diffraction data model, the BARC thickness must be a parameter of the model.

The diffraction data model may be either a theoretical model or based on experiment. For example, if the diffraction data model is a theoretical model, the diffraction data model may be based on rigorous coupled wave theory (RCWT). Because the scattered light in a scatterometry measurement will depend upon both the optical as well as structural parameters of the layers (at least those layers contributing to the scattering of the incident light) of the semiconductor device, the theoretical model will depend on these structural and optical parameters. The parameters will include the index of refraction of the layers, the thickness of the first layer 12, the size and shape of the plurality of holes, and the thickness and shape of the BARC.

Preferably, the diffraction data model is determined based on experimental data. In this case, scatterometry measurements can be performed on a series of test substrates, for example, where the test substrates have a progressively thicker BARC. Other than the thickness of the BARC, the test substrates should be composed of the same layers underlying the BARC as the substrate where the BARC thickness is to be predicted. In this application the term "test substrate" includes substrates where a functioning device is ultimately formed. Thus, special test substrates need not be manufactured, but the test substrates may come from batches of wafers to be made into functioning devices.

The series of test substrates may be a single substrate where the BARC thickness is progressively increased. Alternatively, the series of test substrates may be several different substrates where the BARC thickness is progressively thicker.

Scatterometry measurements on the series of test substrates will produce a series of calibration diffraction datasets. The thickness of the BARC in the plurality of holes for each of the diffraction datasets in the series may be determined by a method independent of the scatterometry measurements. Independent methods of measuring the BARC thickness include, for example, scanning probe microscopy using a scanning tunneling microscope (STM) or an atomic force microscope (AFM). Another independent method uses a scanning electron microscope (SEM), as is well know in the art.

Once the series of calibration diffraction datasets has been determined for various test substrates having a range of BARC thicknesses in the plurality of holes, the diffraction data model may be determined. The model may be determined, for example, using statistical regression techniques or a neural network. In either case, the diffraction model has the BARC thickness in the holes as a parameter. If a neural network methodology is used, the neural network will be trained using the calibration diffraction datasets.

The diffraction model may be determined, for example, based on a linear regression model dependent on the single parameter, the thickness t. In this case, the regression model may be expressed as follows, assuming a linear relationship between the thickness parameter vector y, and the diffraction data matrix X:

$$y = Xc + e \quad \text{(Eq. 1)},$$

where y is the thickness parameter vector whose elements are the thicknesses of the various test substrates, X is the diffraction data matrix whose elements are the diffraction datasets of the test substrates, c is the linear coefficient vector relating X and y, and e is the random residuals vector, not explained by the linear model. Since the elements of the thickness parameter vector y are the various thicknesses of the test substrates, the vector y will have n elements, where n is the number of test substrates. On the other hand, the number of elements of the linear coefficient vector c is the number, p, of data points to be considered in the diffraction data of the diffraction datasets of the test substrates.

The linear coefficient vector c may be determined by various regression statistical methods. For example, ordinary least squares (OLS), principle components regression (PCR) and partial least squares (PLS) may be used as is known in the art. The linear coefficient vector c, and thus the diffraction data model, may be determined in the calibration phase.

Prediction Phase

Once the diffraction data model is determined, the thickness of the BARC 18 in the plurality of holes may be predicted by comparing diffraction data from the scatterometry measurement of BARC 18 to the diffraction data model. If the diffraction data model consists of a neural network trained using the diffraction data from a series of test substrates, the predicted thickness is determined using the trained neural network and diffraction data from the scatterometry measurement of the BARC 18.

If the diffraction model is determined using a linear regression model with the linear coefficient vector c, the thickness is determined based on the linear coefficient vector c and the diffraction data of the scatterometry measurement. Specifically the thickness is determined by multiplying the linear coefficient vector c by a vector x, whose elements are the diffraction data of the scatterometry measurement.

Thickness Control Device

Figure 2:
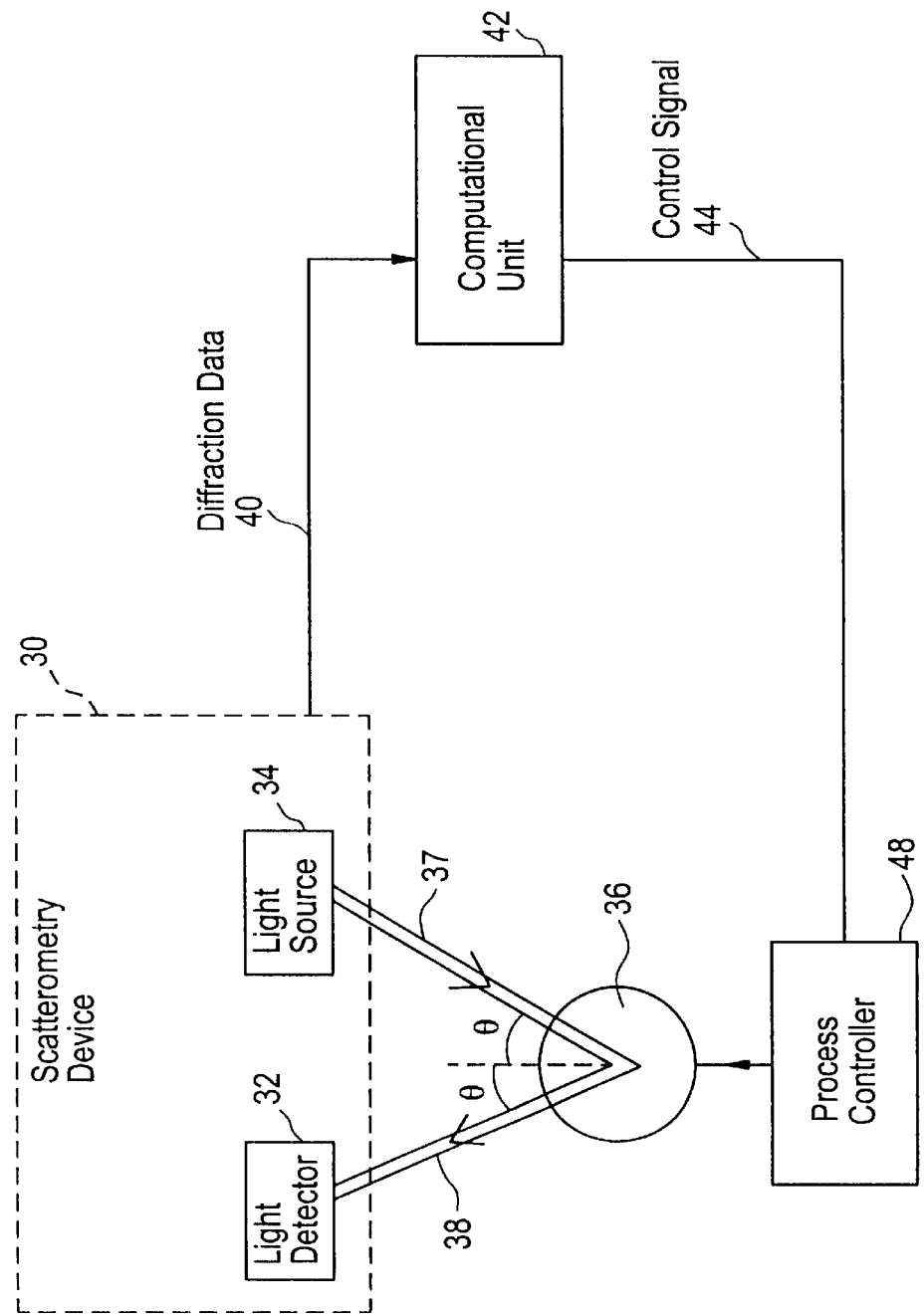
FIG. 2 is a schematic of a thickness control device according to an embodiment of the present invention.

FIG. 2 is a schematic of a thickness control device according to an embodiment of the present invention. The thickness control device of FIG. 2 may be used to control the thickness of the BARC in a plurality of holes in a layer on a semiconductor substrate, such as the substrate shown in FIGS. 1A–1D.

The thickness control device includes a scatterometer 30, delineated by the dashed lines, which comprises a light source 32 and a light detector 34. The scatterometer performs scatterometry measurements on a substrate 36. In the FIG. 2, substrate 36 is positioned outside the scatterometer 30. Alternatively, the substrate 36 may be positioned within the scatterometer 30.

The light source 32 emits an incident light beam 37 at an angle θ with respect to a normal to the surface of the substrate 36. The light source 32 may be a laser, for example, or a broad spectral range source such as a lamp. Light is scattered from the substrate 36, and the scattering light 38 scattered at an angle −θ with respect to a normal to the surface of the substrate 36, is detected by light detector 34. During a scatterometry measurement, the angle θ (and correspondingly the angle −θ) may be scanned across a range of values. This may be accomplished, for example, by changing the relative position and/or orientation of the light source, light detector, and substrate. Scatterometers for accomplishing this will be described in further detail later. Alternatively the angle θ may remain fixed and the light detector may provide an intensity for a range of light wavelengths. A scatterometer for accomplishing this will also be described in further detail later.

Upon performing a scatterometry measurement, the diffraction data 40 from the measurement is sent to a computational unit 42. The computational unit 42 may be a computer, for example. The computational unit 42 provides a prediction of a BARC thickness in a plurality of holes by comparing the diffraction data with a diffraction data model. The computational unit 42 may provide this prediction according to the methods discussed above, i.e., using neural network methodology or statistical regression techniques. The computational unit 42 may also include a memory that stores information relating to the diffraction data model, such as the diffraction data sets or linear coefficient vector c.

After the computational unit has provided a predicted thickness, $t_p$, of the BARC in a plurality of holes, the computational unit then compares the predicted thickness, $t_p$, to a target thickness range, $\Delta t_t$. If the predicted thickness, $t_p$, falls within the target thickness range, $\Delta t_t$, the computational unit 42 sends a cease processing signal as a control signal 44 to a process controller 48 instructing the process controller 48 to cease forming the BARC. The process controller 48 may be part of a process unit (not shown) processing the BARC.

If, on the other hand the predicted thickness, $t_p$, falls outside the target thickness range, $\Delta t_t$, the computational unit 42 does not send a cease processing signal as a control signal 44 to the process controller 48 instructing the process controller to cease forming the BARC. Thus, in this case, the processor controller 48 will continue to cause the BARC to be formed.

The process controller 48 controls the formation of the BARC. For example, if the process unit is spinning on the BARC, the process controller may control the process unit to no longer spin on the BARC. On the other hand if more of the BARC is to be spun-on, the process controller 48 will control the process unit to spin-on more of the BARC.

The computational unit 42 continues to receive diffraction data from the scatterometry device and to output a control signal 44 to the process controller 48 throughout the formation of the BARC. Thus, thickness control system can provide feedback to the process unit and controls the thickness of the BARC.

It should be noted that while determining the diffraction data model may require a substantial amount of time, predicting the BARC thickness can be done rapidly. Thus, the present invention allows for real-time BARC formation. Furthermore scatterometry is a non-invasive technique which may be performed in-situ while the BARC is being formed.

Figure 3:
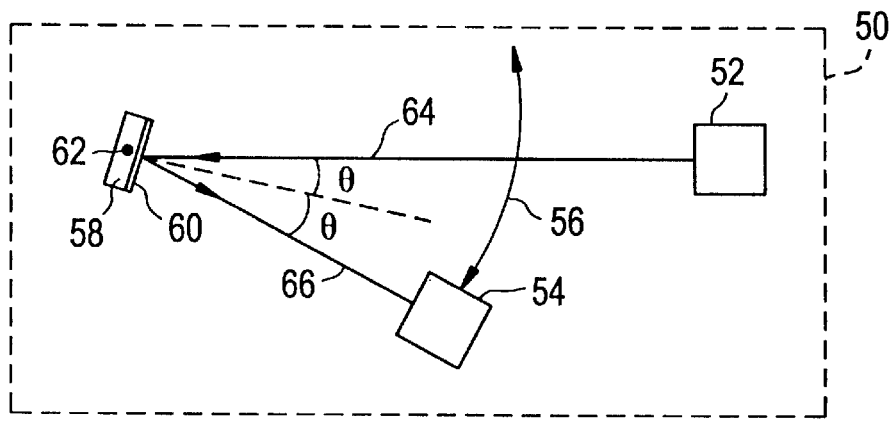
FIG. 3 illustrates a 2-θ scatterometer arrangement for use in the thickness control device according to an embodiment of the invention.
Figure 4:
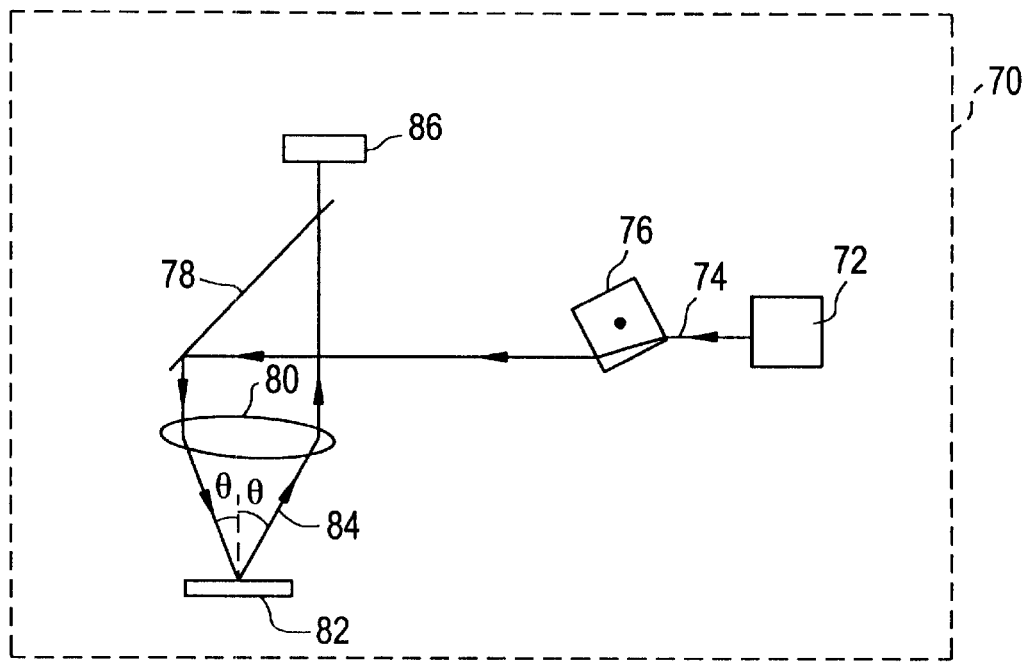
FIG. 4 illustrates a lens scatterometer system for use in the thickness control device according to an embodiment of the invention.
Figure 5:
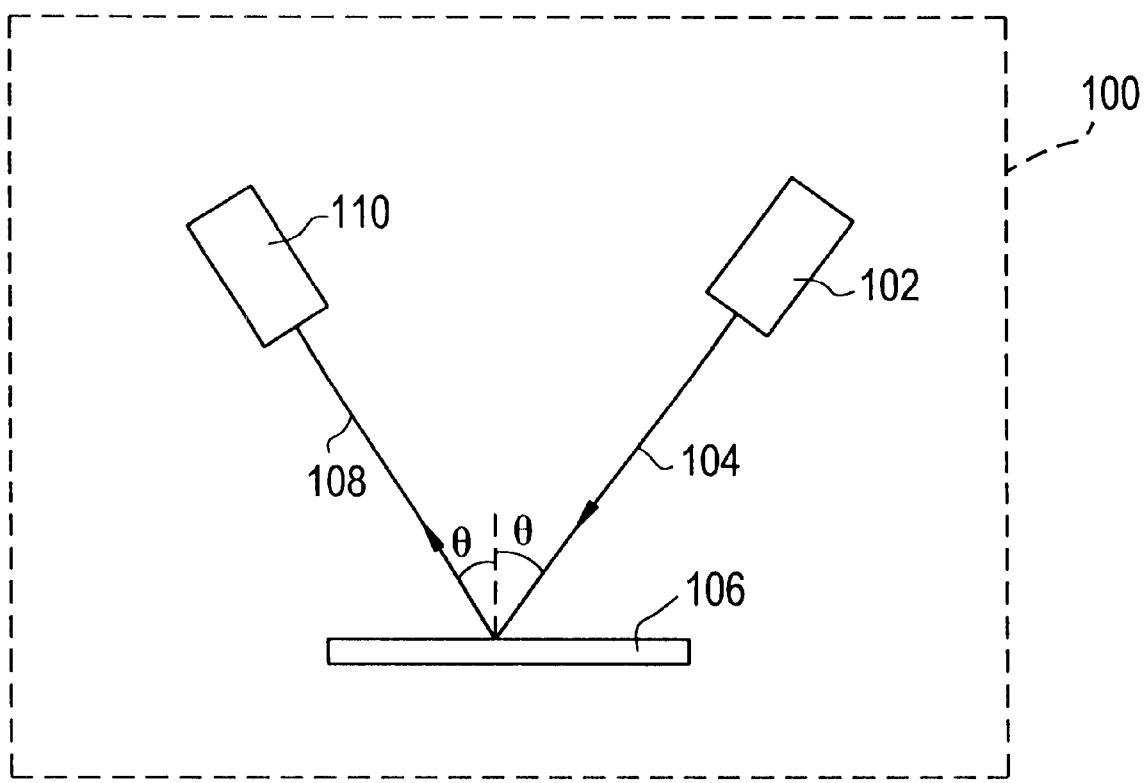
FIG. 5 illustrates another scatterometer arrangement, where a range of diffracted light wavelengths are detected, for use in the thickness control device according to an embodiment of the invention.

FIGS. 3 through 5 illustrate three scatterometer configurations that may be used in the thickness controlling device. These three devices are merely exemplary, however, and other scatterometers may be used instead.

FIG. 3 illustrates a 2-θ scatterometer arrangement 50. The scatterometer includes a light source 52, such as a laser, and a light detector 54. The light source directs an incident light beam 64 that is diffracted by a substrate 60 affixed to a substrate holder 58. The substrate holder 58 pivots about an axis 62 to rotate the substrate 60. The diffracted light beam 66 is detected by light detector 54.

The light detector 54 moves about an arc 56. In operation the substrate 60 is rotated and the light detector 54 is correspondingly and cooperatively moved along the arc 56 to scan across a variety of incident angles θ.

FIG. 4 illustrates another scatterometer arrangement know as a lens scatterometer system 70. This scatterometer includes a light source 72, such as a laser, that directs an incident light beam 74 towards a rotating optical block 76. The rotating optical block 76 translates the incident light beam 74, but does not change the direction of the beam. The incident light beam 74 is thus directed to a beam splitter 78 that reflects the incident light beam 74 to a lens element 80 that directs the incident light beam onto a substrate 82.

The incident light beam 74 is diffracted by the substrate as a diffracted light beam 84 and is directed by the lens element 80 to a light detector 86. In operation the rotating block 76 is rotated to translate the incident light beam 74 across different regions of the lens element to change the angle of the incident beam on the substrate and thus to scan across a variety of incident angles θ.

FIG. 5 illustrates yet another scatterometer arrangement 100. In this embodiment the light source 102 is a white light source emitting light in a broad spectral range. The incident light 104 from the light source 102 is incident at an angle θ on a substrate 106 where it is diffracted. The diffracted light beam 108 which is that portion of the diffracted light diffracted at an angle −θ is detected by the light detector 110. In this embodiment the light detector 110 is a spectrometer. Further, in this embodiment the angle θ remains fixed, and the spectrometer measures the intensity of the scattered light at a variety of wavelengths. Thus, in this embodiment, the diffraction data is the intensity as a function of wavelength, not intensity as a function of angle θ.

While there has been illustrated and described what is at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

We claim:

1. A method of forming a semiconductor device comprising:

providing a semiconductor substrate with a first layer, the first layer having a first surface and a plurality of holes therein;

forming a bottom anti-reflective coating (BARC) in the plurality of holes and on the first surface;

performing a scatterometry measurement on at least a portion of the BARC to produce measurement diffraction data;

predicting a thickness of the BARC in the plurality of holes by comparing the measurement diffraction data to a model of diffraction data to provide a predicted thickness, $t_p$, and determining if the predicted thickness, $t_p$, is within a target thickness range, $\Delta t_d$; and controlling the BARC forming step in response to the BARC thickness predicting step.

2. The method of claim 1, wherein the BARC is an organic layer.

3. The method of claim 2, wherein forming the BARC comprises spinning on a BARC precursor material.

4. The method of claim 3, wherein the scatterometry measurements are performed while the BARC precursor material is spun-on.

5. The method of claim 3, wherein the step of forming the BARC further comprises curing the BARC precursor material.

6. The method of claim 5, wherein the scatterometry measurements are performed while the BARC precursor material is cured.

7. The method of claim 1, wherein the model of diffraction data is a theoretical model.

8. The method of claim 7, wherein the theoretical model is based on rigorous coupled wave theory (RCWT).

9. The method of claim 1, wherein the model of diffraction data is based on a series of scatterometry diffraction datasets, each dataset corresponding to a scattering measurement of a BARC over a semiconductor substrate, wherein the thickness of the BARC progressively changes in respective scatterometry measurements of the series.

10. The method of claim 9, wherein the model of diffraction data is further based on a statistical analysis of the series of diffraction datasets.

11. The method of claim 10, wherein the statistical analysis is a regression analysis with BARC thickness as a parameter.

12. The method of claim 9, wherein the model of diffraction data is further based on a neural network derived using the series of scatterometry diffraction datasets.

13. The method of claim 12, wherein the neural network is derived using the BARC thickness as a parameter.

14. The method of claim 1, further comprising:

forming a photoresist layer on the BARC.

* * * * *